United States Patent
Dunn et al.

(10) Patent No.: US 12,477,683 B2
(45) Date of Patent: Nov. 18, 2025

(54) FAN CONTROL FOR ELECTRONIC DISPLAY ASSEMBLIES

(71) Applicant: Manufacturing Resources International, Inc., Alpharetta, GA (US)

(72) Inventors: William Dunn, Alpharetta, GA (US); Mike Brown, Cumming, GA (US); John Schuch, Buford, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 19/034,216

(22) Filed: Jan. 22, 2025

(65) Prior Publication Data

US 2025/0169028 A1    May 22, 2025

Related U.S. Application Data

(63) Continuation of application No. 18/666,444, filed on May 16, 2024, now Pat. No. 12,245,399, which is a continuation of application No. 17/694,261, filed on Mar. 14, 2022, now Pat. No. 12,022,635.

(60) Provisional application No. 63/239,273, filed on Aug. 31, 2021, provisional application No. 63/161,147, filed on Mar. 15, 2021.

(51) Int. Cl.
*H05K 7/20* (2006.01)

(52) U.S. Cl.
CPC ..... *H05K 7/20209* (2013.01); *H05K 7/20972* (2013.01)

(58) Field of Classification Search
CPC ........... H05K 7/20972; H05K 7/20145; H05K 7/20209; H05K 7/202; H05K 7/20172; H05K 7/20136; H05K 5/0213; H05K 5/0214; H05K 7/206; H05K 7/20518; H05K 7/20954; G06F 1/20; G06F 1/1601; G09F 9/35

USPC .......................................................... 361/695
See application file for complete search history.

(56) References Cited

U.S. PATENT DOCUMENTS

| | | | | |
|---|---|---|---|---|
| 5,962,933 | A * | 10/1999 | Henderson | G06F 13/4081 307/130 |
| 2011/0001898 | A1 | 1/2011 | Mikubo et al. | |
| 2013/0107143 | A1 | 5/2013 | Dighde et al. | |
| 2013/0242504 | A1 * | 9/2013 | Cartes | H05K 7/20836 361/691 |
| 2015/0009627 | A1 * | 1/2015 | Dunn | G02F 1/133382 361/695 |

(Continued)

FOREIGN PATENT DOCUMENTS

KR    20140081903 A    7/2014

*Primary Examiner* — Mandeep S Buttar
(74) *Attorney, Agent, or Firm* — Standley Law Group LLP; Jeffrey S. Standley; Adam J. Smith

(57) ABSTRACT

Display assemblies with enhanced fan control are disclosed. An electronic display is located within a housing. A controller receives readings from sensors located at an airflow pathway extending within the housing and determines which of the readings is, relatively, furthest from a predetermined, associated parameter. The controller drives fans located at the airflow pathway based on the relatively furthest one of the readings in accordance with a control scheme including reading-dependent, preprogrammed operating parameters for the fans.

19 Claims, 10 Drawing Sheets

(56) References Cited

U.S. PATENT DOCUMENTS

| | | | |
|---|---|---|---|
| 2015/0177750 A1* | 6/2015 | Bailey | G05D 23/1932 |
| | | | 700/275 |
| 2017/0160775 A1* | 6/2017 | Sun | G06F 1/20 |
| 2019/0289754 A1* | 9/2019 | Hubbard | G02F 1/133308 |
| 2020/0128701 A1* | 4/2020 | Whitehead | H05K 7/20209 |
| 2021/0068302 A1* | 3/2021 | North | G06F 9/5055 |
| 2024/0179869 A1* | 5/2024 | Pamidighantam | |
| | | | H05K 7/20209 |

* cited by examiner

FAN CONTROL FOR ELECTRONIC DISPLAY ASSEMBLIES

CROSS-REFERENCE TO RELATED APPLICATIONS

This application is a continuation of U.S. application Ser. No. 18/666,444 filed May 16, 2024, which is continuation of U.S. application Ser. No. 17/694,261 filed Mar. 14, 2022, now U.S. Pat. No. 12,022,635 issued Jun. 25, 2024, which claims the benefit of US provisional application Ser. no. 63/161,147 filed Mar. 15, 2021, and also claims the benefit of U.S. provisional application Ser. No. 63/239,273 filed Aug. 31, 2021, the disclosures of each of the foregoing are hereby incorporated by reference as if fully restated herein.

TECHNICAL FIELD

Exemplary embodiments relate generally to systems and methods for controlling condensation in electronic display assemblies.

BACKGROUND AND SUMMARY OF THE INVENTION

The use of electronic displays, such as for advertising, in the out-of-home market has increased in popularity over recent years. Being located outdoors, such electronic displays are frequently exposed to harsh conditions, including, but not limited to, solar loading, extreme temperatures, precipitation, moisture, contaminants, vandalism, wildlife, and the like. To protect the electronic displays and associated sensitive components from such harsh conditions, it is known to place the electronic displays in ruggedized housings. Such housings may fully or partially seal the electronic displays and other associated sensitive components.

It is known to thermally manage such electronic display assemblies using ambient air and/or circulating gas. Such ambient air may pass through one or more open loop airflow pathways within the assembly, and may thermally interact with circulating gas in one or more closed loop airflow pathways within the assembly where such closed loop pathways are used.

Operating such display assemblies in certain environments may result in the introduction of ambient air, such as into the one or more open loop airflow pathways, having a sufficiently different temperature relative to circulating gas and/or components of the display assembly as to result in the formation of condensation inside such display assemblies. For example, without limitation, the introduction of relatively cool ambient air into the display assembly may result in a sufficiently low dewpoint within the display assembly that water vapor in the ambient air and/or circulating gas within the assembly condenses into liquid, which may cause fogging and/or undesirable moisture exposure to sensitive electronic components. More specifically, for example, without limitation, the introduction of relatively cool ambient air into air-to-air heat exchangers contained within the display assembly may cause surfaces of these heat exchangers to drop below the dewpoint of the relative humidity contained within the fully or partially sealed enclosure resulting in condensation. Additionally, any inside surface of the fully or partially sealed enclosure may reach, or even drop below, the outside ambient temperature (e.g., when ice/snow is piled on top of a housing of the assembly), resulting in cold spots within the assembly whose temperature is below the internal dewpoint which may cause the formation of condensation.

Furthermore, owners, operators, and/or manufacturers of such electronic display assemblies are increasingly undertaking power efficiency efforts. Such power efficiency efforts may include, for example, without limitation, decreasing illumination levels for lighting elements of the electronic display assemblies at night (e.g., partially or to zero), which may result in the electronic display assemblies becoming relatively cool, increasing the likelihood of condensation by lowering the dewpoint inside the display assembly. This may be particularly prevalent when combined with the ingestion of relatively cool ambient air.

What is needed are systems and methods for controlling condensation in electronic display assemblies. Systems and methods for controlling condensation in electronic display assemblies are provided.

In general, gaskets utilized in such electronic display assemblies may be sufficient to entirely or substantially to keep out liquids, but sometimes such gaskets are not gas-tight or entirely gas-tight. Therefore, moisture can sometimes permeate through the gasket, such as in the form of water vapor, and enter an otherwise closed loop airflow pathway. Such closed loop airflow pathways may still be considered sealed, as such closed loop airflow pathways are kept entirely or substantially free from solid or liquid particulate such as, but not limited to, dust, debris, precipitation, combinations thereof, or the like. In general, when the interior of an otherwise fully or partially sealed enclosure (e.g., closed loop airflow pathway) is warmer than the outdoor environment, moisture may escape the otherwise fully or partially sealed enclosure, such as, but not limited to, by way of gaseous particles in the air which may permeate the liquid-tight, but not necessarily vapor-tight, gaskets. More specifically, for example, without limitation, as heat is added to the circulating gas within the closed loop airflow pathways, the circulating gas may expand and some of that expanding air may be forced through the gasket or otherwise to a location outside of the closed loop airflow pathway, and take moisture in the circulating gas with it. The converse may also be true.

The relative humidity within an electronic display assembly may be determined, such as, but not limited to, by way of one or more sensors configured to measure humidity and/or temperature. The relative humidity may be determined at the one or more sensors or at a separate controller. The same or different temperature measures may be used in conjunction with the relative humidity to determine the dewpoint of air inside the electronic display assembly. The measurements from multiple sensors may be used and/or multiple readings may be aggregated in various ways.

A dewpoint spread may be calculated between the temperature of ambient air and the calculated dewpoint. For example, without limitation, the temperature of the ambient air, such as for calculating the dewpoint and/or dewpoint spread, may be determined as the lesser of one or more temperature readings of ambient air at said intake or along said portion of said one or more open loop airflow pathways of the assembly or an internet-retrieved local ambient air temperature.

Where the dewpoint spread is determined to be less than 0° C., it may be determined with a high degree of confidence that condensation is occurring. Where the dewpoint spread is determined to be greater than 0° C., but less than a predetermined threshold "X", which may be in the range of +2 to +5° C. in exemplary embodiments, it may be determined that condensation may be occurring. Where the dewpoint spread is determined to be greater than $X°$ C., it may be determined with a high degree of confidence that condensation will not occur. Modified operations may be undertaken where it is determined that condensation is occurring or may be occurring according to the above-described criteria, but not when condensation is not occurring according to the above-described criteria. Determining which of the interior surfaces is coldest, and thus potentially having condensation, may be difficult to determine. Thus, modified operations may be conservatively undertaken for both where condensation is occurring and where condensation may be occurring according to the above-described criteria.

In exemplary embodiments, without limitation, where the dewpoint spread is greater than or equal to $X°$ C., which is variable but in exemplary embodiments may be $2°$ C., between $2°$ C.-$5°$ C., $4°$ C., or $5°$ C. for example, without limitation, a determination may be made that no condensation is likely. Where the dewpoint spread is greater than $Y°$ C., which is variable but in exemplary embodiments may be $0°$ C., between $0°$ C.-$2°$ C., or $2°$ C. for example, without limitation, and less than $X°$ C., a determination may be made that condensation may or may not be present. Where the dewpoint spread is less than or equal to $Y°$ C., a determination may be made that condensation is likely or definitely present within the electronic display assembly. In exemplary embodiments, the controller may be configured to operate the assembly normally (e.g., without any modified operations to minimize, reduce, control, and/or eliminate condensation formation within the electronic display assembly) where the determination is made that no condensation is likely, and may initiate certain modified operations where the determination is made that condensation may or may not be present and/or that condensation is likely present. Such modified operations may be configured to minimize, reduce, control, and/or eliminate condensation formation within the electronic display assembly.

In other exemplary embodiments, where a determination is made that condensation may or may not be present and/or that condensation is likely present (e.g., dewpoint spread less than $X°$ C., or less than or equal to $X°$ C.), a determination may be made as to whether certain safety thresholds are met and/or exceeded. If the safety thresholds are met and/or exceeded, the electronic display assembly may be configured to operate normally (e.g., without modified, condensation control operations). In this way, the operational safety of the display assembly and/or its components may be prioritized. If the safety thresholds are not met and/or exceeded, the electronic display assembly may operate under the modified operating parameters configured to minimize, control, reduce, and/or eliminate condensation within the electronic display assembly.

In yet other exemplary embodiments, modified operations may be undertaken based on a dewpoint threshold and buffer, with or without the secondary check for safety thresholds. For example, without limitation, a threshold dewpoint spread of $A°$ C. and a buffer of $B°$ C. may be set. Where the dewpoint spread exceeds AC by more than $B°$ C., modified operations may be undertaken. In exemplary embodiments, a check to ensure that the safety thresholds are not met or exceeded may be first undertaken. $A°$ C. and/or $B°$ C. may each be independent variables and may be, for example, without limitations, each $2°$ C., $A=4°$ C. and $B=2°$ C., $A=5°$ C. and $B=1-4°$ C., combinations thereof, or the like.

The safety thresholds may comprise any temperature or other condition of any components. For example, without limitation, the safety thresholds may be designed to prevent overheating of sensitive, critical, and/or expensive electronic components. Modified operations, as explained more fully below, may reduce or eliminate ambient air introduction and/or promote heat generation within the unit. The normal operations may permit the ingestion of increased or unlimited amounts of ambient air, which may be prioritized over condensation where the safety thresholds are met and/or exceeded. Where such safety thresholds are not met and/or exceeded, condensation control may be prioritized.

Modified operations may include, for example, without limitation, increasing heat in the electronic display assembly, such as, but not limited to, by reducing fan speed, operating time, combinations thereof, or the like and/or increasing power to lighting elements, restricting the ability to turn off or reduce power to the lighting elements, combination thereof, or the like. Modified operations may reduce, prevent, control, and/or eliminate the formation of condensation within the display assembly by decreasing the ingestion of outside (ambient) air, which may be relatively cold (e.g., turning ambient air fans off and/or minimizing their operation) and/or increasing power to lighting elements (e.g., turning on, increasing power, preventing dimming).

For non-emissive displays, such as LCDs, overall image luminance may be kept low as desired (e.g., no noticeable increase in visible image luminance) by turning backlight power up while concurrently turning image gray scale down, for example, without limitation. For non-emissive or emissive displays, power consumption may alternatively, or additionally, be increased by turning drive current to maximum while turning pulse width modulation (PWM) control to minimum levels required to maintain desired perceptive brightness, for example, without limitation. In exemplary embodiments, modified operations may be performed once internal and/or ambient temperatures, dewpoint, relative humidity, and/or dewpoint spread reach a certain threshold, range, combination thereof, or the like and/or where certain safety thresholds are not yet met and/or exceeded.

Such condensation controls may be particularly useful where the electronic display assembly is powered down or otherwise placed in a reduced power mode and/or when ambient temperatures drop, one or both of which may occur during nighttime hours, winter hours, and/or under power efficiency efforts to name a few examples. In exemplary embodiments, without limitation, the systems and methods shown and/or described herein may accomplish condensation control without the need for a separate and/or dedicated heater, thereby reducing power consumption and/or noise.

The various criteria described herein, including, but not limited to, the dewpoint spread ranges and safety thresholds, are merely exemplary and are not intended to be limiting. Other criteria and/or thresholds may be utilized. For example, without limitation, other data points, dewpoint spread criteria, operation modifications, temperatures, thresholds, safety thresholds, and/or ranges, may be utilized.

Alternatively, or additionally, it may be desirable to operate air circulation devices within the display assembly to control temperatures within the display assembly and/or provide condensation control. In exemplary embodiments, the air circulation devices may comprise fan units, each of which may comprise one or more fans, and may be associated with one or more sensors, such as temperature sensors. Zones may be virtually defined within the display assemblies, each of which may include one or more of the air circulation devices and one or more of the associated sensors.

Operational ranges for the air circulation devices may be established. Such operational ranges may be programmed at, or stored at, the controller(s). Such operational ranges may be stored in association with one or more of the air circulation devices. Desired operating ranges may be established for the sensors. Such desired operating ranges may be programmed at, or stored at, the controller(s). Such desired operating ranges may be stored in association with one or more of the sensors.

Operational ranges for the air circulation devices and/or desired operating ranges for the sensors may be specific to the date, time, ambient conditions, combinations thereof, or the like. Operational ranges for the air circulation devices and/or desired operating ranges for the sensors may be specific to the zone, air circulation device, and/or senor or for the whole display assembly.

Readings from the sensors may be taken periodically, continuously, sporadically, or the like. Operation of some or all of the air circulation devices may be controlled by the highest sensor reading relative to the associated desired operating range. Such control may be performed on a zone-by-zone basis or for the entire display assembly.

Where a maximum operating temperature is reached or exceeded at one or more of the sensors, speed or other operating conditions (e.g., number of active fans, volumetric flow rate, power supplied, etc.) of the air circulation devices may be increased, such as by the controller(s), until a maximum operational level is reached. If the maximum operating temperature is reached or exceeded at one or more of the sensors, power to the backlight may be reduced until temperatures fall below the maximum operating temperatures. Such reduction may be made in an inversely proportional fashion to how far the temperature has exceeded the maximum operating temperature.

Sensor readings may be continuously or periodically retaken and operations adjusted accordingly.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configurations and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
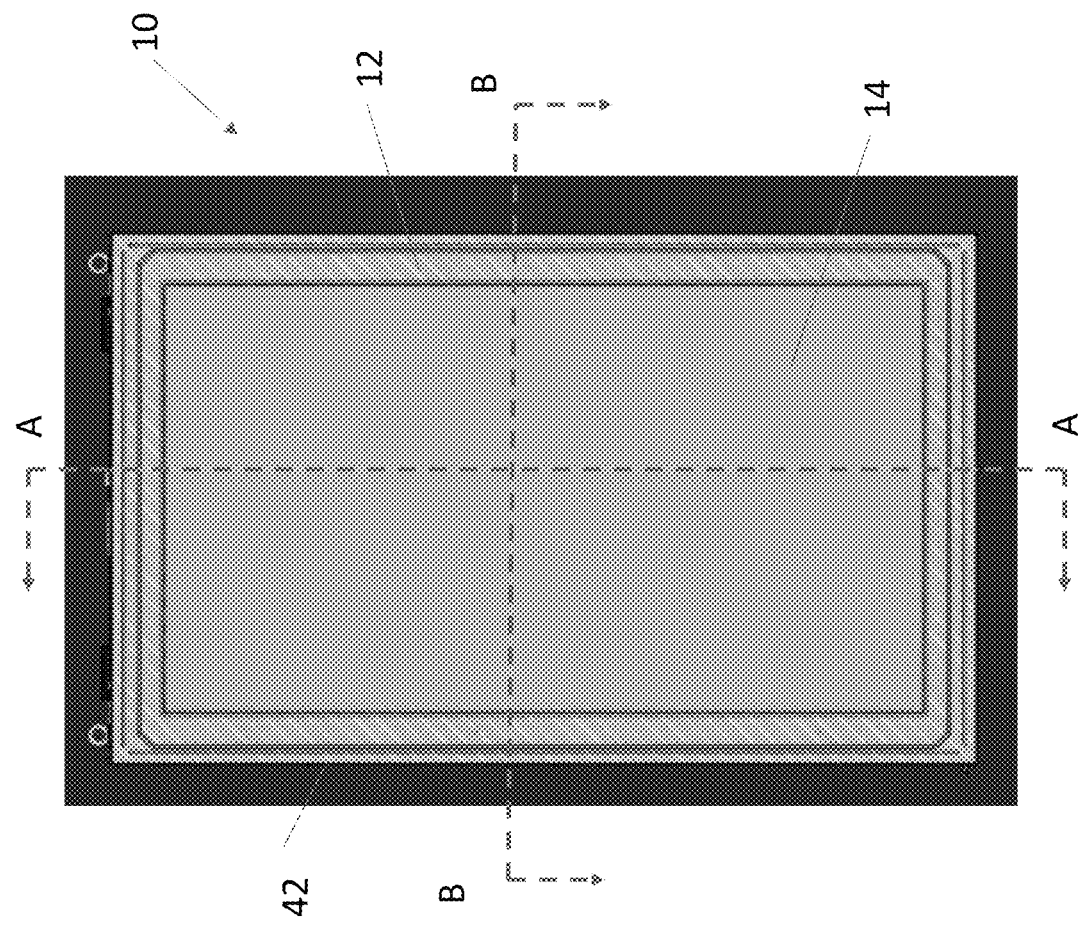
FIG. 1 is a perspective view of an exemplary display assembly in accordance with the present invention and indicating section lines A-A and B-B.
Figure 2A:
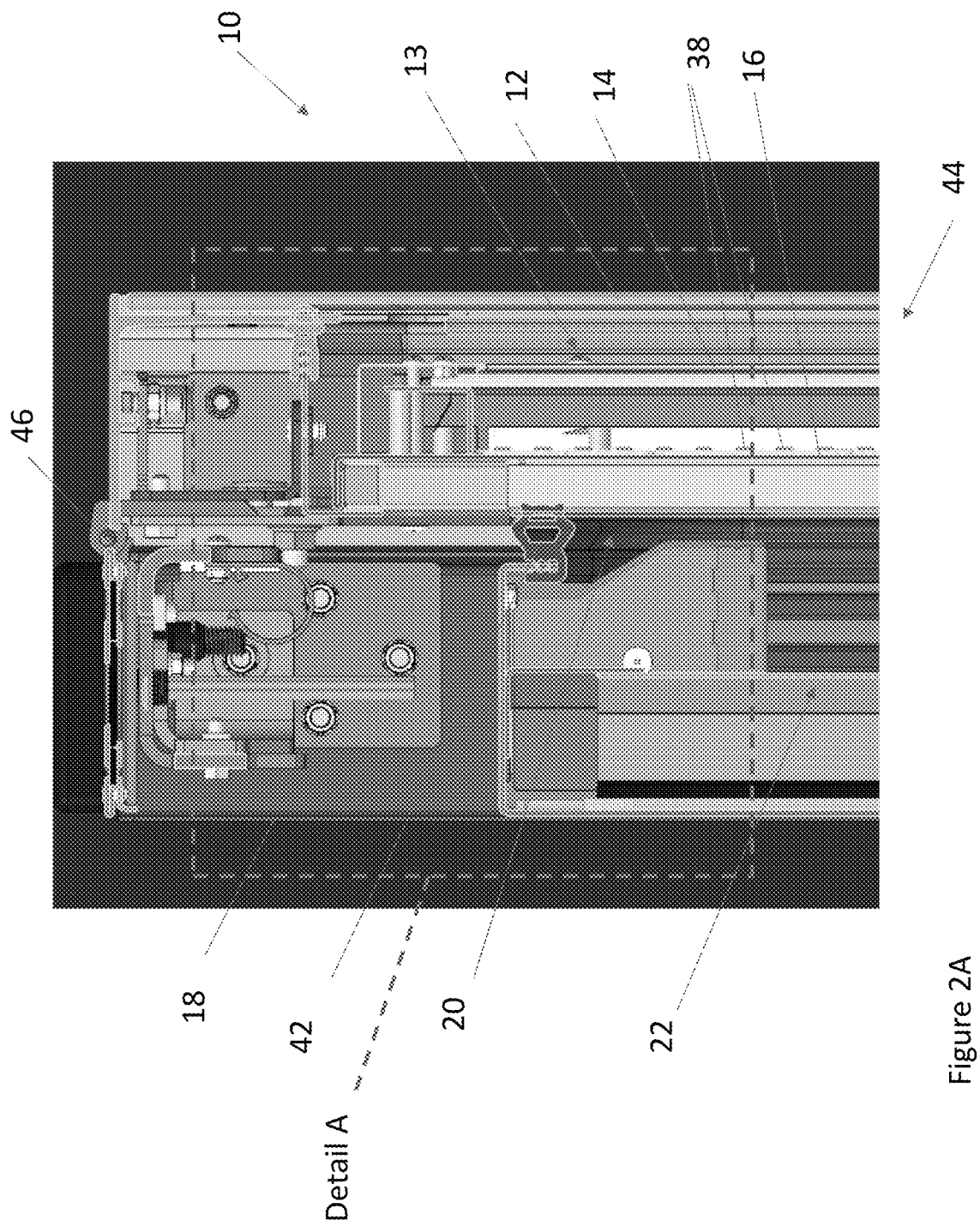
FIG. 2A is a detailed side sectional view of the display assembly of FIG. 1 taken along section line A-A and indicating detail A.
Figure 2B:
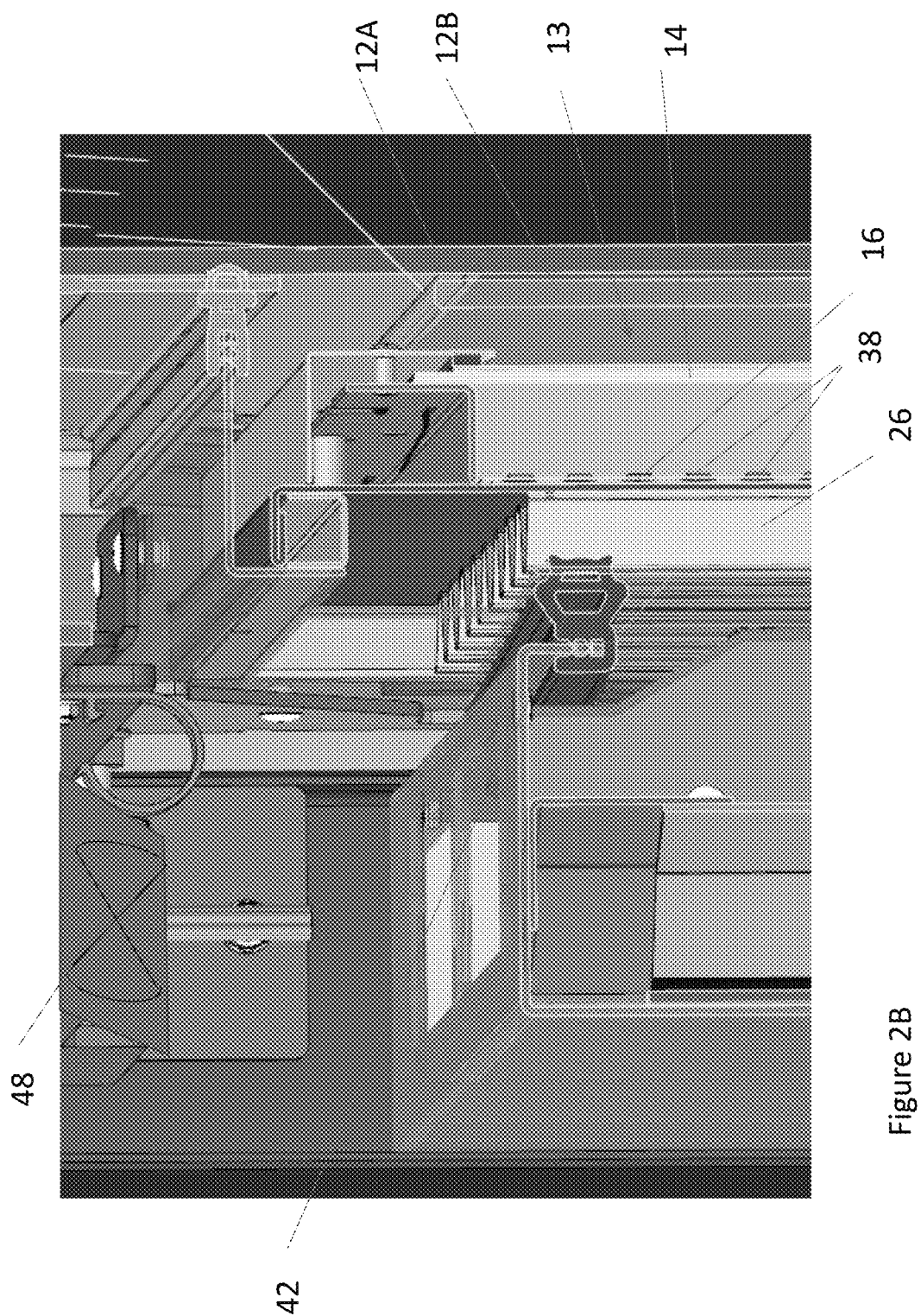
FIG. 2B is a detailed perspective view of detail A of FIG. 2A.
Figure 3:
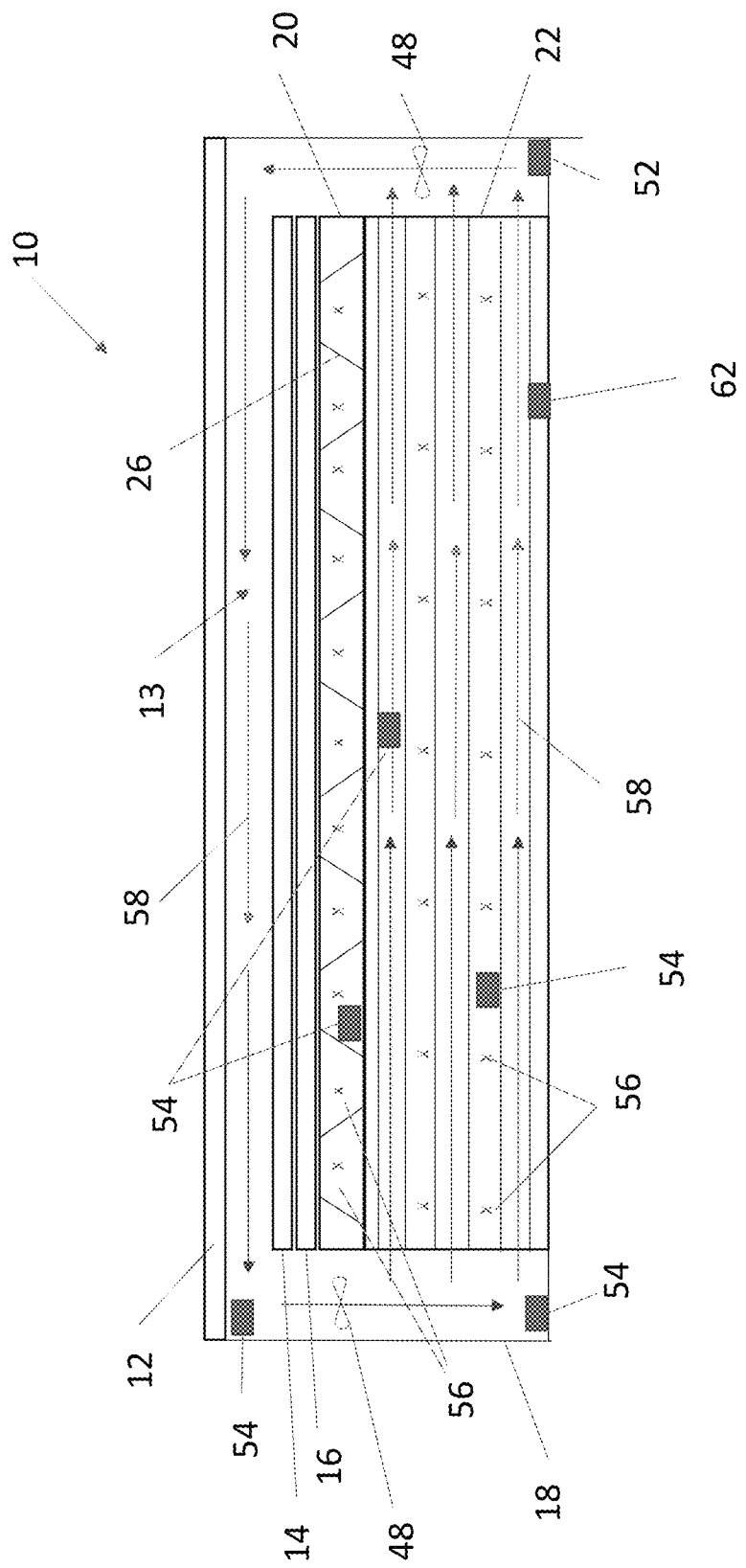
FIG. 3 is a simplified top sectional view of the display assembly of FIG. 1 taken along section line B-B.

FIG. 1 through FIG. 3 illustrate an exemplary electronic display assembly 10. The assembly 10 may comprise a housing 18. The assembly 10 may comprise a cover panel 12. The cover panel 12 may comprise a single layer or multiple layers 12A, 12B bonded together, such as by way of one or more optical adhesives. The cover panel 12 may be located forward of, and may be spaced apart from, an electronic display layer 14. The electronic display layer 14 may comprise a layer of liquid crystals (e.g., an LCD), a plasma display, OLED display, LED display, combinations thereof, or the like. The cover panel 12 may form a forward portion of the housing 18. The housing 18 may substantially enclose the electronic display layer 14.

The cover panel 12 may be transparent or translucent such that images displayed at the electronic display layer 14 are visible to an intended viewer through the cover panel 12. The cover panel 12 may be configured to protect the electronic display layer 14 and/or other components of the electronic display assembly 10. The cover panel 12 may, alternatively, or additionally, be configured to enhance optics of the images displayed at the electronic display layer 14. The cover panel 12 and/or electronic display layer 14 may comprise one or more polarizers, anti-reflective films, surface treatments, combinations thereof, or the like. A front air gap 13 may be located rearward of the cover panel 12 and forward of the electronic display layer 14. The front air gap 13 may form part of a closed loop airflow pathway for circulating gas 58.

An illumination device 16 may be provided adjacent to at least a portion of the electronic display layer 14. The illumination device 16 may comprise a number of lighting elements 38. The lighting elements 38 may comprise light emitting diodes (LEDs), though other kinds or types of lighting elements 38 may be utilized. The illumination device 16 may be configured to provide illumination to the electronic display layer 14 when powered. For example, without limitation, the illumination device 16 may be configured to provide direct backlight for the electronic display layer 14 and may be positioned rearward of the electronic display layer 14. Alternatively, or additionally, the illumination device 16 may be configured to provide edge lighting for the electronic display layer 14 and may be positioned around some or all of a perimeter of the electronic display layer 14, one or more light guides, reflective elements, combinations thereof, or the like. In exemplary embodiments, the illumination device 16 may comprise a number of the lighting elements 38 provided on one or more tiles, mounted to a substrate (e.g., printed circuit board), combinations thereof, or the like. Any number, arrangement, and/or type of the lighting elements 38 may be used.

In other exemplary embodiments, the electronic display layer 14 may be an emissive display and/or may be configured to illuminate without the need for a separate and/or dedicated illumination device 16. Examples of such embodiments include, without limitation, OLED displays, plasma displays, LED displays, combinations thereof, or the like.

The assembly 10 may comprise one or more open loop heat exchangers (hereinafter also "OL HX") 20. The OL HX 20 may be configured to accommodate ambient air. The OL HX 20 may be provided rearward of the illumination device 16. In exemplary embodiments, the OL HX 20 may extend along some or all of the illumination device 16 so as to absorb some or all of the heat generated by the illumination device 16 when in use. The OL HX 20 may extend directly along the illumination device 16 or may be spaced apart therefrom. For example, without limitation, one or more thermally conductive layers, air gaps, and/or spacers may be positioned between the illumination structure and the OL HX 20.

The OL HX 20 may comprise one or more layers. In exemplary embodiments, some or all of the layers of the OL HX 20 may comprise a corrugated structure 26. The corrugated structure 26 may comprise a zigzag pattern which extends between two or more panels or layers of the OL HX 20, thereby forming a number of channels or pathways within the OL HX 20. Alternatively, or additionally, the OL HX 20 may comprise a number of tubes (e.g., square, rectangular, round, combinations thereof, or the like) defining passageways or channels for ambient air.

In exemplary embodiments, the OL HX 20 may be in fluid communication with one or more intakes and exhausts provided in the housing 18. Such intakes and exhausts may comprise one or more apertures in the housing 18 which permit the intake and exhaust, respectively, of ambient air from the assembly 10.

One or more air circulation devices 48, such as, but not limited to, fans may be provided within or otherwise in fluid communication with the OL HX 20 and/or other portions of one or more open loop airflow pathways within the electronic display assembly 10 to cause the ingestion of ambient air into the assembly 10, flow through the one or more open loop airflow pathways, and exhaustion from the assembly 10 when operated. Such air circulation devices 48 may be in electronic communication with one or more controller(s) 52. The air circulation devices 48 may comprise, for example, without limitation, axial fans, centrifugal fans, combinations thereof, or the like. Any number and/or type of air circulation devices 48 at any one or number of locations within the display assembly 10 may be utilized.

The assembly 10 may comprise one or more open loop/closed loop heat exchangers (hereinafter also "OL/CL HX") 22. The OL/CL HX 22 may be provided rearward of the illumination device 16. The OL/CL HX 22 may comprise multiple layers. In exemplary embodiments, each of the layers may be configured to accommodate one of: only ambient air as part of one or more of the open loop airflow pathways in the assembly 10, or circulating gas as part of one or more closed loop airflow pathways in the assembly 10. The layers may be arranged, for example, without limitation, vertically or horizontally adjacent one another. For example, without limitation, the layers may alternate between being configured to accommodate ambient air and circulating gas. In exemplary embodiments, a first portion of the layers may form part of the same or a different open loop airflow pathway as the OL HX 20 and a second portion of the layers may form part of the same or a different closed loop airflow pathway as the front air gap 13. The OL/CL HX 22 may be in fluid communication with the same or different intake(s) and exhaust(s) as the OL HX 20. The OL/CL HX 22 may be in fluid communication with the front air gap 13, though such is not required.

In exemplary embodiments, the electronic display assembly 10 may comprise multiple electronic display layers 14. In such embodiments, the electronic display assembly 10 may comprise multiple cover panels 12, illumination structures 16, OL HX 20, OL/CL HX 22, combinations thereof, or the like. However, at least the OL/CL HX 22 may be common to multiple electronic display layers 14 in some embodiments. For example, without limitation, the electronic display assembly 10 may comprise a first and second electronic display layer 14 provided in a back-to-back arrangement with front air gaps 13 fluidly connected to a common OL/CL HX 22 but separate OL HXs 20 for each electronic display layer 14. Such electronic display layers 14 may be provided in the same or different housings 18.

In exemplary embodiments, the electronic display layer 14, the illumination device 16, and OL HX 20 may be provided within an access assembly 44 along with one or more components, such as, but not limited to, electronic circuits, air circulation devices 48, sensors 54, controller(s) 52, power supplies, wiring, processors, video players, cameras, microphones, combinations thereof, and the like. The access assembly 44 may comprise a housing, framework, or one or more structural members, which may be attached to the housing 18 by way of one or more movement devices 46, such as, but not limited to, hinges, springs, levers, pistons, combinations thereof, or the like configured to facilitate movement of the access assembly 44 between an opened position where the access assembly 44 is moved away from the housing 18 and a closed position where the access panel 44 is adjacent the housing 18. One or more sealing devices 42, such as, but not limited to, gaskets, may be provided between the housing 18 and the access assembly 44 to partially or completely seal when said access assembly 44 is placed in the closed position. In exemplary embodiments, such sealing devices 42 may be liquid impermeable, but may be vapor permeable. When moved into the open position, certain components of the electronic display assembly 10, such as, but not limited to, a rear area of the OL HX 20, the OL/CL HX 22, customer equipment, server racks, storage compartments, combinations thereof, or the like may be accessible. Furthermore, the access assembly 44 may be removed for service and/or replacement. Where more than one electronic display layer 14 is utilized, more than one access assembly 44 with the same or similar components may be provided and connected to the housing 18.

Ambient air 56 may extend through one or more open loop airflow pathways within one or more of the OL HX 20, the OL/CL HX 22, combinations thereof, or the like. Such open loop airflow pathway(s) may be partially, mostly, substantially, or entirely sealed to separate ambient air 56 from circulating gas 58 traveling through one or more closed loop airflow pathways within one or more of the front air gap 13, the OL/CL HX 22, within the housing 18, combinations thereof, or the like. In this way, particularly the ambient air 56 may be kept partially, mostly, substantially, or entirely separate from the circulating gas 58.

One or more air circulation devices 48, such as, but not limited to, fans, may be provided within or otherwise in fluid communication with the OL/CL HX 22, the front air gap 13, and/or other portions of one or more closed loop airflow pathways within the electronic display assembly 10 to cause the flow of circulating gas through some or all of the same when the air circulation devices 48 are operated. Such air circulation devices 48 may be in electronic communication with the same or different ones of the one or more controller(s) 52. The air circulation devices 48 may comprise, for example, without limitation, axial fans, centrifugal fans, combinations thereof, or the like. Any number and/or type of air circulation devices 48 at any one or number of locations within the display assembly 10 may be utilized.

Alternatively, or additionally, the display assemblies 10 may comprise heaters, air conditioning units, filters, thermoelectric modules, heat sinks, combinations thereof, or the like.

The electronic display assembly 10 may comprise one or more sensors 54. The sensors 54 may be provided at one or more locations at the electronic display assembly 10. Some or all of the sensors 54 may be in electronic communication with one or more of the same or different controller(s) 52. Such sensors 54 may include, for example, without limitation, location detection devices. Alternatively, or additionally, location data may be pre-programmed or updated manually. The sensor 54 may include temperature sensors, which may be located at intake(s), along the one or more open loop airflow pathways, at the exhaust(s), within the closed loop airflow pathways, at the illumination device 16, at power supplies (which may be, for example, without limitation, located at and/or along rear surfaces of the illumination device 16), at FPGA (Field Programable Gate Array) die, at various framework or other components of the electronic display assembly 10, at the one or more controller(s) 52, a FPGA die, processor board, combinations thereof, or the like. The sensors 54 may comprise one or more humidity sensors, which may be provided at the one or more open loop airflow pathways, the one or more closed loop pathways, one or more components of the display assembly 10, combinations thereof, or the like. The various sensors 54 may be configured to report readings data to the controller(s) 52. The size, shape, and/or location of the sensors 54 shown and/or described are merely exemplary and are not intended to be limiting. Any type, kind, and/or number of sensors 54 may be provided at any number of locations within the display assembly 10 to measure any number or type of data points.

While illustrated internal to the display assembly 10, one or more of the sensors 54 and/or controller(s) 52 may be external to the display assembly 10. For example, without limitation, one or more of the sensors 54 may be located outside the housing 18. As another example, without limitation, some or all of the data points may be retrieved over one or more networks, such as the world wide web, from remote weather stations. The display assembly 10 may comprise one or more network communication devices 62 configured to retrieve such data, which may be periodically or continuously updated. As another example, without limitation, the controller(s) 52 may comprise one or more remote monitoring and/or control systems, such as, but not limited to, computers, smartphones, tablets, servers, combinations thereof, or the like, which may be in electronic communication with one or more controller(s) 52, processors, combinations thereof, or the like by way of one or more network connectivity devices. Data from both sensors 54 at the display assembly 10 and retrieved from outside sources may be utilized. For example, without limitation, data from outside sources may be retrieved by way of the network communication devices 62.

In exemplary embodiments, at least the controller 52 and/or network communication devices 62 are provided at the closed loop airflow pathways, though any location may be utilized.

Figure 4:
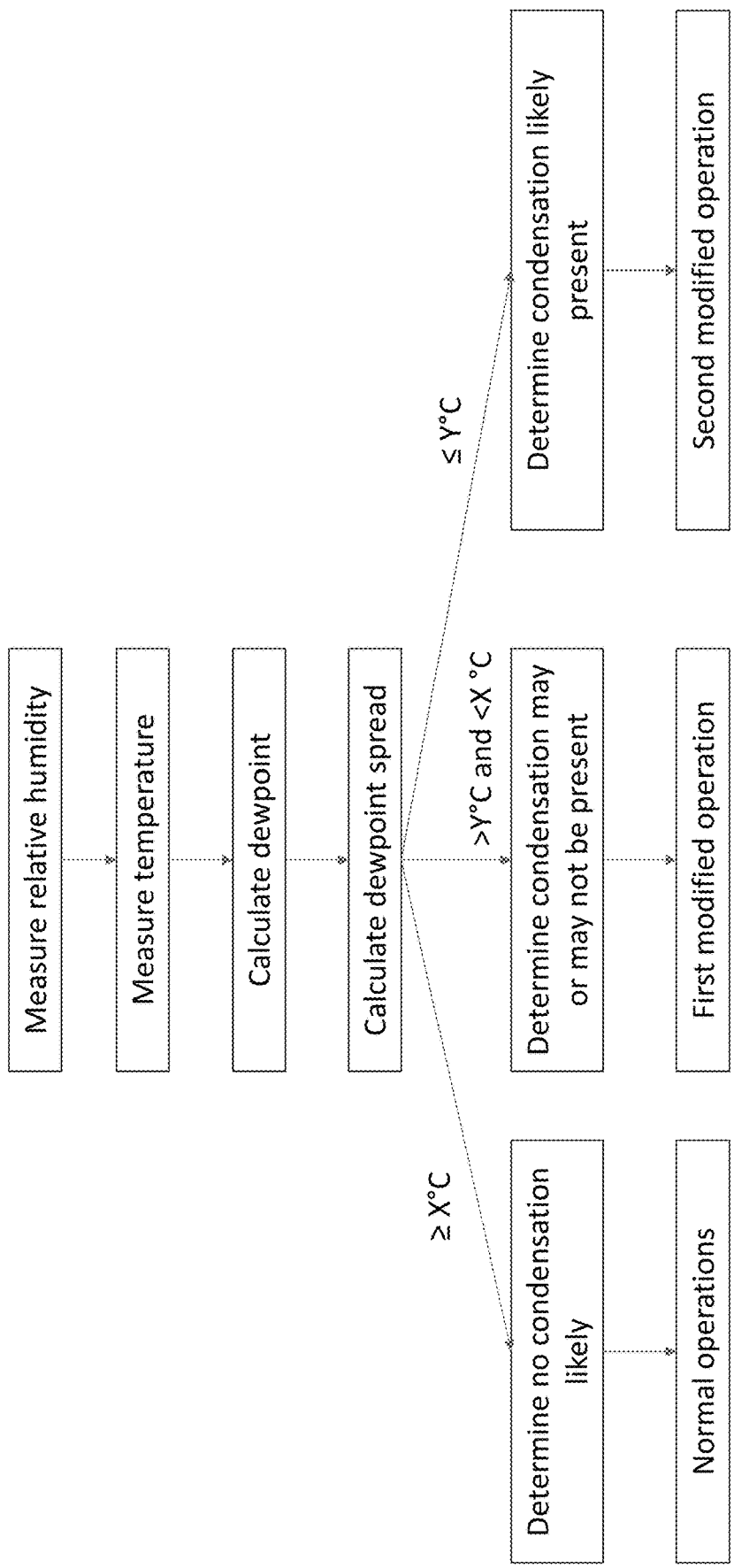
FIG. 4 is a flow chart with exemplary logic for operating the electronic display assembly of FIGS. 1-3 in accordance with the present invention.

FIG. 4 illustrates a flow chart with exemplary logic for operating the electronic display assembly 10 to control condensation. The relative humidity of air inside the display assembly 10 may be measured. For example, without limitation, the relative humidity may be determined by sampling data from the sensor(s) 54 configured to measure relative humidity at the display assembly 10. Alternatively, or additionally, the relative humidity may be determined by sampling data from the sensor(s) 54 configured to measure humidity at the display assembly 10 and the sensor(s) 54 may configured to measure temperature at the display assembly 10, which may be the same or different from one another, and the relative humidity within the display assembly 10 may be calculated or determined from such data. Such calculation or determination may be made at the sensor(s) 54 or the controller(s) 52, such as based on a table or other data sources. Such temperature and/or humidity readings may be determined from sensor(s) 54 located at the one or more open loop airflow pathways of the ambient air, the one or more closed loop airflow pathways of the circulating gas, combinations thereof, or the like. Alternatively, or additionally, the temperature, humidity, and/or relative humidity may be retrieved from one or more network sources based on reported and/or measured conditions proximate a location of the electronic display assembly 10.

The dewpoint may be calculated from the relative humidity, humidity, and/or certain temperature data. The dewpoint may be calculated at the controller(s) 52 and/or sensor(s) 54, such as, for example, without limitation, by using formulas available at: http://bmcnoldy.rsmas.miami.edu/Humidity.html and/or https://bmcnoldy.rsmas.miami.edu/mia/. Any formula or algorithm for calculating dewpoint, known or yet to be developed, may be utilized. Alternatively, or additionally, the dewpoint may be retrieved from one or more network sources based on reported and/or measured conditions proximate the location of the electronic display assembly 10. The temperature used to calculate the dewpoint may be determined from sensor(s) 54 located at the one or more open loop airflow pathways of the ambient air, the one or more closed loop airflow pathways of the circulating gas, one or more network sources based on reported, measured conditions proximate a location of the electronic display assembly 10, combinations thereof, or the like.

The dewpoint spread may be calculated, such as by way of the controller(s) 52. The dewpoint spread may be calculated between the certain temperature data and the dewpoint. The temperature may be determined from sensor(s) 54 located at the one or more open loop airflow pathways of the ambient air, the one or more closed loop airflow pathways of the circulating gas, one or more network sources based on reported, measured conditions proximate a location of the electronic display assembly 10, combinations thereof, or the like. In exemplary embodiments, without limitation, the temperature may be determined as the lessor of sensor(s) 54 readings from within the electronic display assembly 10 or retrieved temperature conditions as retrieved from one or more network sources based on reported and/or measured conditions proximate the location of the electronic display assembly 10. Data from network sources shown and/or described herein may be retrieved, for example, without limitation, by way of the one or more network communication devices 62.

If the dewpoint spread is greater than or equal to X° C., which is variable but may be 2° C., between 2° C. and 5° C., 4° C., or 5° C. for example, without limitation, a determination may be made, such as at the controller(s) 52, that no condensation is likely present. In such cases, the controller(s) 52 may be configured to operate the electronic display assembly 10 normally, such as under default operating parameters. If the dewpoint spread is greater than Y° C., which is variable but may be set of 0° C., between 0° C. and 2° C., or 2° C. in exemplary embodiments, and less than X° C., a determination may be made that condensation may or may not be present. In such cases, the controller(s) 52 may be configured to operate the electronic display assembly 10 in a first modified operating mode. If the dewpoint spread is less than or equal to Y° C., a determination may be made that condensation is likely present. In such cases, the controller(s) 52 may be configured to operate the electronic display assembly 10 in a second modified operating mode. The second modified operating mode may be the same or different from the first modified operating mode.

Other criteria, ranges, and/or thresholds may be utilized. For example, without limitation, other dewpoint spread criteria, ranges, and/or thresholds may be utilized. For example, without limitation, where a dewpoint spread equal to or less than X° C. is determined, the controller(s) 52 may be configured to command modified operations. As another example, without limitation, a half, quarter, or full degree margin of error may be utilized such that dewpoint spread equal to or less than X+1° C., by way of non-limiting example, may result in the controller(s) 52 commanding modified operations. These are just examples and are not intended to be limiting. Any number of thresholds and/or ranges and modified operating modes may be utilized.

The modified operating mode(s) (including, but not limited to, the first and second modified operating modes) may include commanding certain actions, such as, but not limited to, by way of the controller(s) 52, configured to raise the temperature of the electronic display assembly 10, thereby reducing the likelihood of condensation, and/or drive out moisture in the electronic display assembly 10. In exemplary embodiments, moisture may be driven out by increasing the temperature which may cause the air within the assembly, such as, but not limited to, the circulating gas 58 in the one or more closed loop airflow pathways, to expand. Because the closed loop airflow pathways are otherwise fully or partially sealed, this may result in driving out at least a portion of the circulating gas 58 from the one or more closed loop pathways, which may bring vaporized moisture with it. The air may permeate through one or more gaskets, which may be liquid tight but not necessarily vapor tight. In exemplary embodiments, the increased heat and/or airflow, such as from the one or more air circulation devices 48, may cause liquid moisture to vaporize or otherwise be gathered into the circulating gas which is then driven out of the display assembly 10.

The modified operating mode(s) may comprise commands to increase illumination at the illumination device 16, such as, but not limited to, driving the lighting elements 38 at an increased power level, reduce local dimming, and/or reduce dynamic dimming of the illumination device 16. This may be accomplished with or without altering operation of the electronic display layer 14. For example, without limitation, the electronic display layer 14 may be commanded to show a blank black screen despite increased illumination to increase heat without causing light pollution. As another example, without limitation, certain parameters of the electronic display layer 14, such as, but not limited to, grayscale may be altered to maintain essentially the same visible image characteristics while increasing the illumination. In these ways, the image displayed may appear unaltered to viewers, may conform to customer requirements, and/or prevent or reduce light pollution for example, without limitation. Alternatively, or additionally, limiting light leakage may maximize heat retention within the assembly 10.

The modified operating mode(s) may, alternatively, or additionally, comprise commands to reduce speed of and/or cease or otherwise minimize operation of air circulation devices 48 associated with the open loop airflow pathway(s). This may reduce the amount of relatively cool ambient air ingested into the assembly 10, which may cause temperatures to rise, or at least not lower as quickly. Operations of the air circulation devices 48 associated with the closed loop airflow pathway(s) may be modified as well. For example, without limitation, commands to increase the speed or and/or operation of such air circulation devices 48 may be increased, which may cause the circulating gas 58 to pick up condensation moisture.

In exemplary embodiments, once adequate temperatures, relative humidity, dewpoint, and/or dewpoint spread is reached, the modified operating mode(s) may be ceased and/or normal operations may be resumed. In exemplary embodiments, the commands shown and/or described herein may be carried out by the controller(s) 52.

Normal operating mode may be default mode or otherwise preprogramed operating parameter, conditions, and/or logic. Such normal operating mode may permit relatively higher or unlimited air circulation device 48 speeds, run times, combinations thereof, or the like, particularly, but not limited to, for those air circulation devices 48 associated with the open loop airflow pathways.

Figure 5:
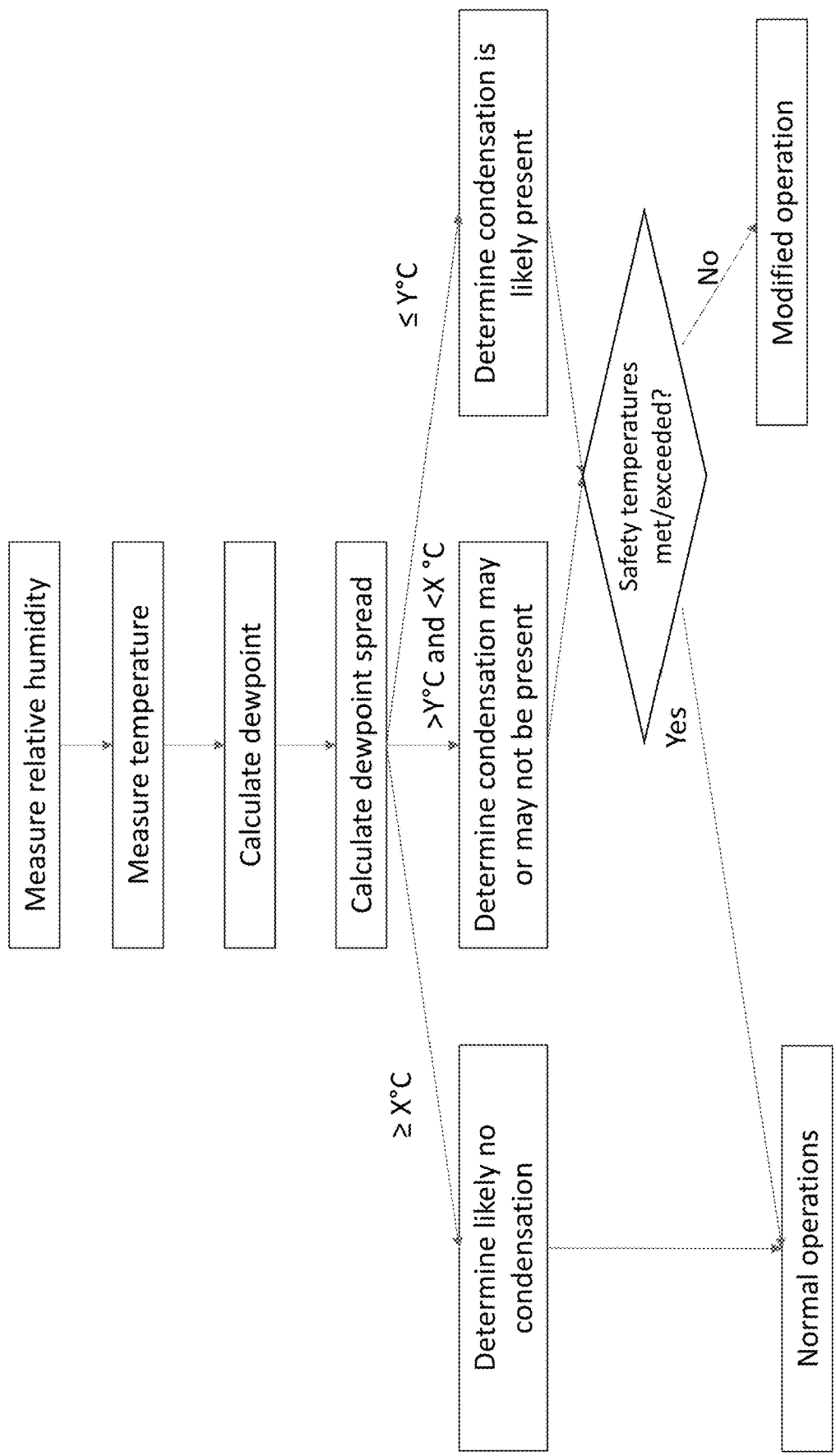
FIG. 5 is a flow chart with other exemplary logic for operating the electronic display assembly of FIGS. 1-3 in accordance with the present invention.

FIG. 5 illustrates a flow chart with other exemplary logic for operating the electronic display assembly 10 to minimize, reduce, control and/or eliminate condensation. The steps shown and/or described with respect to FIG. 5 may be the same or similar to those shown and/or described with respect to FIG. 4 except as otherwise specified herein. For example, without limitation, if a determination is made that condensation may or may not be present or that condensation is likely present, a determination may be made, such as at the controller(s) 52, whether certain safety thresholds are met and/or exceeded. If such safety thresholds are met and/or exceeded, the controller(s) 52 may command the electronic display assembly 10 to operate normally (i.e., without modified operations configured to minimize, reduce, control, and/or eliminate condensation). If some or all of the safety thresholds are not met and/or exceeded, the controller(s) 52 may command the electronic display assembly 10 to initiate modified operations, which may be the same, or different from the modified operations shown and/or described with respect to FIG. 4.

Figure 6:
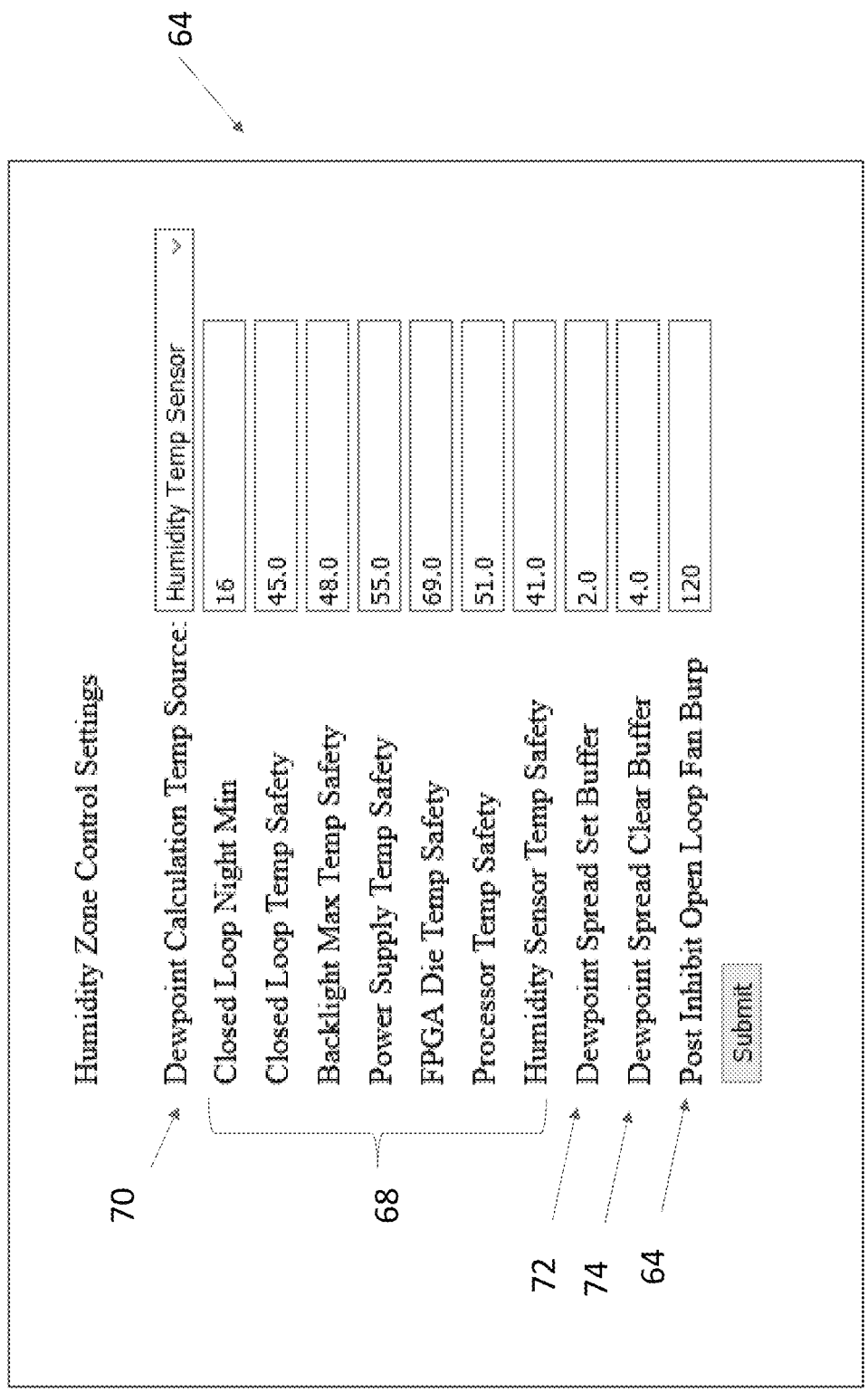
FIG. 6 is a plan view of an exemplary operations programming interface for the electronic display assemblies of FIGS. 1-5.

FIG. 6 illustrates an exemplary interface 64. The interface 64 may be provided at the controller(s) 52 and/or one or more remote electronic devices. The interface 64 may be configured to accept certain user input regarding safety thresholds, modified operations, normal operations, and other operations of the assembly 10. For example, without limitation, such criteria may be selected at one or more remote electronic devices, such as, but not limited to, personal computers, server computers, smartphones, tablets, combinations thereof, or the like and transmitted to the assemblies 10 by way of the network communication devices 62.

In exemplary embodiments, the controller(s) 52 may be configured to first temporarily initiate normal operations upon determination that the safety thresholds are met and/or exceeded. This may cause air circulation devices 48, such as those associated with the open loop airflow pathways, to partially or fully operate at higher levels (e.g., speed, run-times, etc.), ingesting relatively more ambient air in attempt to cool the assembly 10 for a period of time. Normal operations may be resumed for a period of time, such as, but not limited to, 120 seconds, though the amount of time may be variable and may be programmed and/or altered. If after the period of time safety thresholds are no longer met and/or exceeded, modified operations may be resumed. If the safety thresholds are still met and/or exceeded after the period of time, then the assemblies 10 may be configured to continue normal operations for at least a period of time, which may be fixed or indefinite. The period of time may be programmed at the time parameter of the interface 64, for example, without limitation. The safety thresholds may be set, for example, without limitation, at the one or more safety parameters 68 of the interface 64. In exemplary embodiments, only a single temporary initiation of normal operations may be permitted before a longer term or fixed return to normal operations is commanded, such as by the controller(s) 52.

The source for dewpoint calculations may be set at a dewpoint source parameter 70 of the interface 64. For example, without limitation, the source may be selected between an internal relative humidity sensor, remote sources, combinations thereof, or the like.

Any of the variables, parameters, conditions, combinations thereof, or the like may be pre-programmed and/or programmed at the same or different interfaces 64, such as, but not limited to, at the controller(s) 52 and/or by remote devices and the network communication devices 62.

Figure 7A:
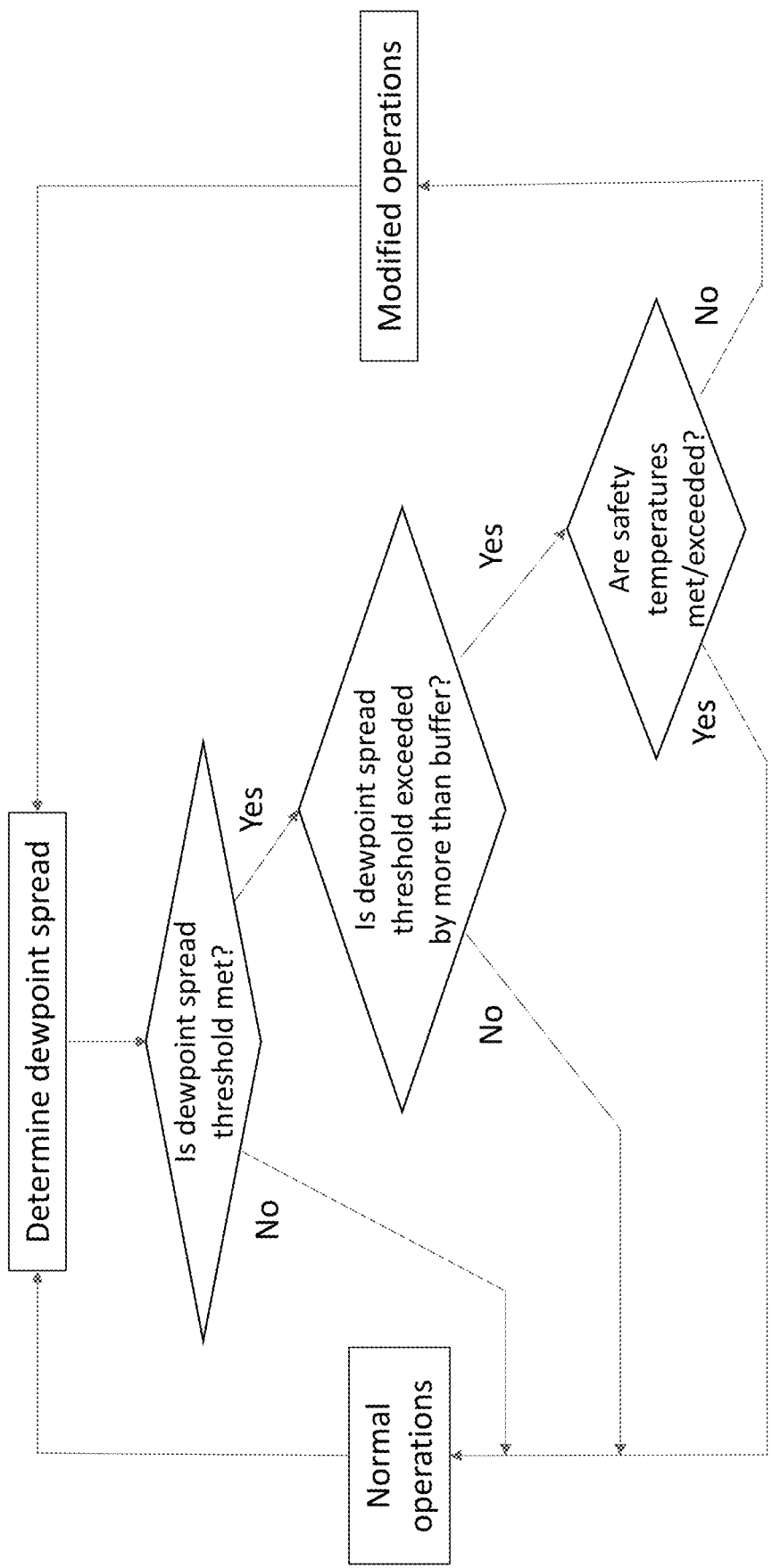
FIG. 7A is a flow chart with other exemplary logic for operating the electronic display assembly of FIGS. 1-6 in accordance with the present invention.

As further illustrated in FIG. 7A, in exemplary embodiments, the controller(s) 52 may be configured to initiate modified or normal operations based upon a dewpoint spread threshold parameter 74 and/or a buffer 72, one or both of which may be programmable at the interface 64. The dewpoint spread threshold parameter 74 and/or buffer 72 may be utilized to determine a dewpoint spread, such as is shown and/or described herein. The controller(s) 52 may be configured to command the assembly 10 to utilize modified operations where the determined dewpoint spread meets the dewpoint spread threshold parameter 74 and/or exceeds the dewpoint spread threshold parameter 74 by at least, or more than, the buffer 72. The controller(s) 52 may be configured to command the assembly 10 to continue utilizing modified operations until such a time as the determined dewpoint spread falls below the dewpoint spread threshold parameter 74, such as by more than the buffer 72. The controller(s) 52 may be configured to command the assembly 10 to utilize normal operations where the determined dewpoint spread does not meet the dewpoint spread threshold parameter 74 and/or is below the dewpoint spread threshold parameter 74 by at least the buffer 72. The controller(s) 52 may be configured to command the assembly 10 to continue utilizing normal operations until such as time as the determined dewpoint spread exceeds the dewpoint spread threshold parameter 74 by at least the buffer 72. In this way, a programmable buffer may be provided in either direction of temperature change against the programmable threshold. However, the safety thresholds may still be considered and prioritized such that the assembly 10 defaults to normal operations where one or more of the safety thresholds are met and/or exceeded.

Figure 7B:
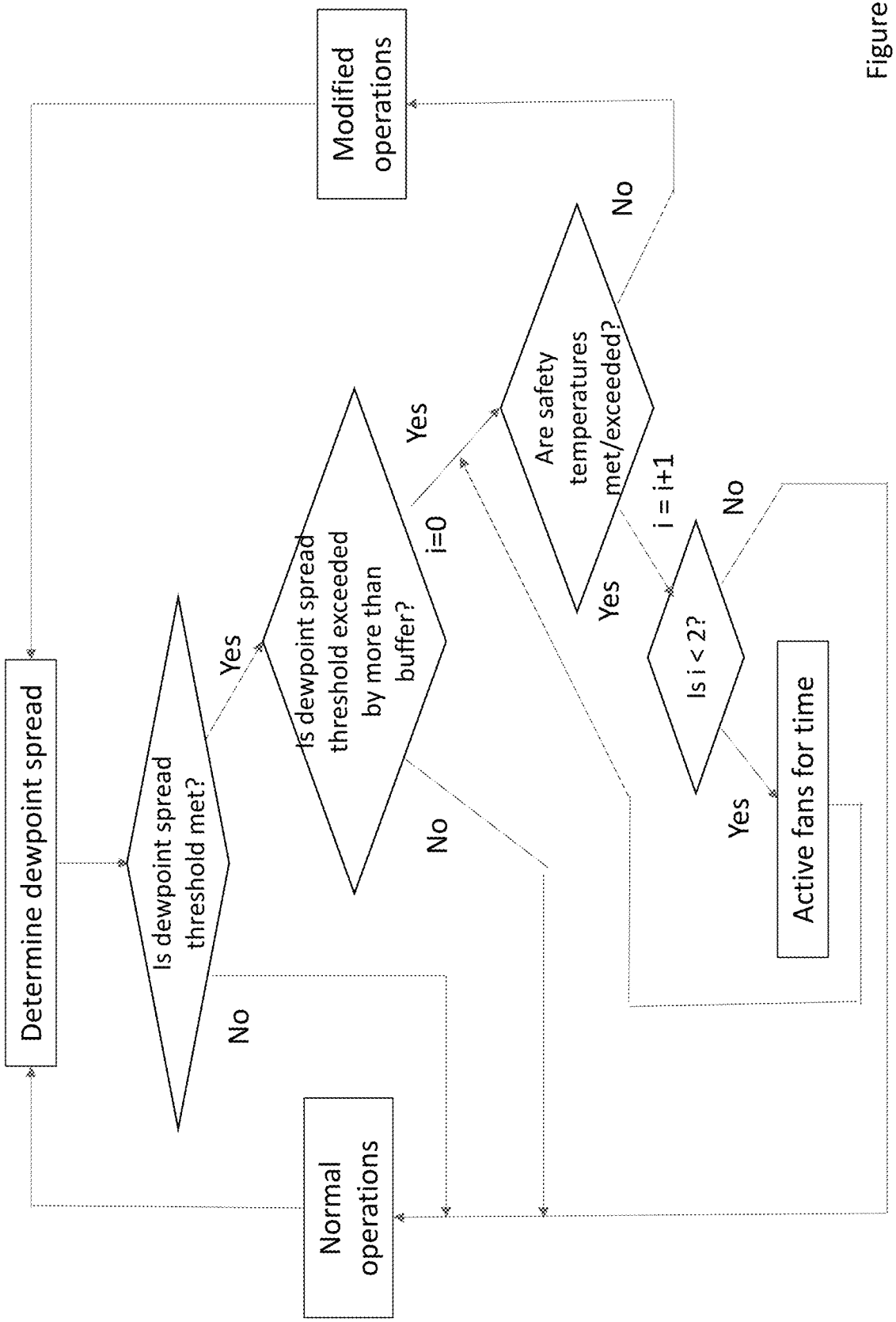
FIG. 7B is a flow chart with other exemplary logic for operating the electronic display assembly of FIGS. 1-7A in accordance with the present invention.

As further illustrated in FIG. 7B, in exemplary embodiments, an attempt to bring the assembly 10 back below or otherwise within the safety thresholds may be provided, such as by way of the programmable time parameter. The controller(s) 52 may be configured to temporarily operate the assembly 10 in normal operations for the time parameter. If, after the time parameter is reached, and one or more of the safety thresholds are still exceeded or readings are otherwise outside the safety thresholds, then the controller(s) 52 may move the assembly 10 to normal operations until such as time as the threshold parameters 74 are exceeded by at least the buffer 72 and readings are within the safety thresholds. If, after the time parameter is reached, readings are within the safety thresholds, then the controller(s) 52 may resume modified operations until such a time as the threshold parameters 74 are exceeded by at least the buffer 72 or readings are outside the safety thresholds. This may give the assembly 10 a chance to recover from slipped operations and/or essentially disregard a potentially erroneous and/or outlier reading. This attempt may be only completed one time before commanding normal operations. For example, only a single loop of the command logic may be permitted.

The safety thresholds may include, for example, without limitation, temperatures above or below certain thresholds, within certain ranges, combinations thereof, or the like, such as measured by at least certain of the sensors 54. In exemplary embodiments, without limitation, the safety thresholds may include some or all of the following: temperature as measured by one or more sensors 54 within or adjacent to the closed loop airflow pathways being below 30° C., temperature as measured by one or more sensors 54 at or in proximity to the illumination device 16 below 40° C., PS (Power Supply) Max is below 50° C., FPGA is below 70° C., controller(s) 52 is/are below 50° C., sensor(s) 52 measuring humidity is/are below 35° C., combinations thereof, or the like. Other criteria and/or thresholds may be utilized, such as, but not limited to, other temperatures from other locations and/or at different thresholds. The safety thresholds, for example, without limitation, may be used to more accurately determine internal temperature of the display assembly 10 and thus may provide a more accurate determination of the likelihood that condensation is present and thus whether modified operations should be undertaken. The safety thresholds in exemplary embodiments may be variable and programmable, such as, but not limited to, at the one or more safety parameters 68 of the interface 64. The safety parameters 68, dewpoint source parameter 70, dewpoint spread threshold parameter 74, buffer 72, and/or time parameter shown in FIG. 6 represent exemplary operating parameters and are provided for example, without limitation.

In exemplary embodiments, modified operations may be provided regularly, such as during transitions from nighttime to daylight hours, following the end of power efficiency modes, during cold temperatures, combinations thereof, or the like. In other exemplary embodiments, modified operations may be dependent on ambient conditions and/or readings from the sensors 54. For example, without limitation, modified operating operations configured to increase the internal temperature of the electronic display assembly 10, such as, but not limited to, increasing power to illumination device 16, reducing speed of air circulation devices 48, during or following relatively cool nighttime hours and/or days or times with relatively cool ambient temperatures, and modified operations configured to drive out moisture, such as, but not limited to, increased speed of air circulation devices 48, during relatively warm daytime hours and/or days or times with relatively warm ambient temperatures.

In other exemplary embodiments, the temperature, humidity, relative humidity, dew point spread, or other data may be derived from predicted weather data, such as based on historical patterns, from internet-based sources, combinations thereof, or the like. In such cases, certain modified operating modes may be scheduled and/or initiated as preventative measures based on predicted data.

The various measures shown and/or described herein, including, but not limited to, humidity measures, temperature measures, combinations thereof, or the like, may be determined by way of multiple measurements from the same or different sensors 54, internet-based sources or other remote measures or user input, combinations thereof, or the like, and the utilized measures may be an average, highest, lowest, mean, median value, combinations thereof, or the like.

In exemplary embodiments, some or all air circulation devices 48 may be kept at a minimum speed, such as regardless of normal or modified operations, to provide relatively uniform temperature within the electronic display assembly 10, consistent readings at sensors 52, combinations thereof, or the like. In exemplary embodiments, without limitation, this minimum speed may be 12% of maximum possible normal operating speed.

Figure 8:
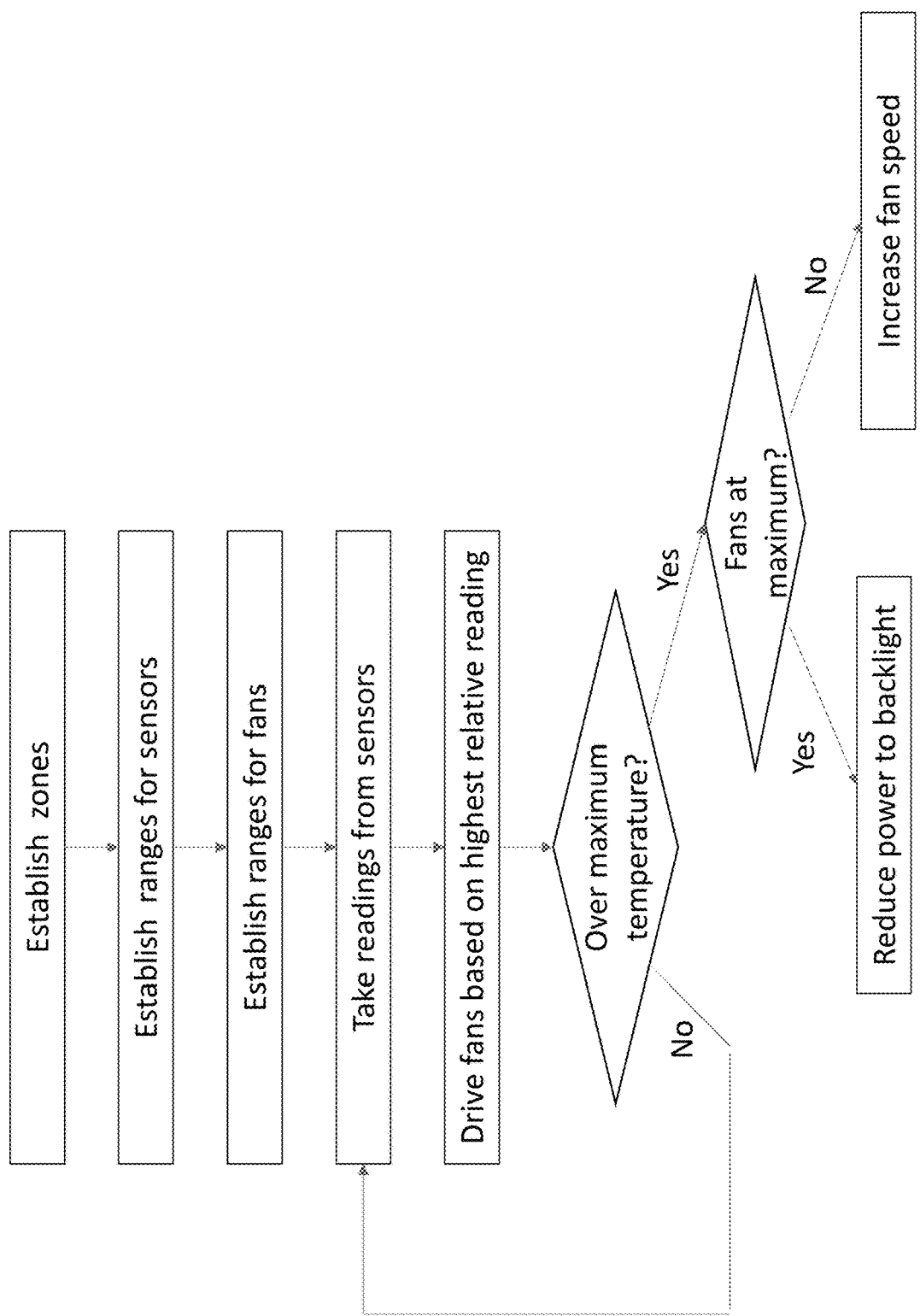
FIG. 8 is a flow chat with exemplary logic for operating the electronic display assembly of FIGS. 1-7B in accordance with the present invention.

FIG. 8 provides other exemplary logic for operating the display assembly 10. It may be desirable to operate the air circulating devices 48 within the display assembly 10 to control temperatures within the display assembly 10 and/or provide condensation control. In exemplary embodiments, each of the air circulating devices 48 may comprise one or more fans, such as provided in banks or sets. Each of the air circulating devices 48 may be associated with one or more of the sensors 54. Each of the sensors 54 may be configured to measure temperature of proximate air.

Zones may be virtually defined within the display assemblies 10, such as at the controller(s) 52. Each zone may be associated with one or more of the air circulating devices 48 and/or one or more of the sensors 54. For example, without limitation, one zone may comprise front air gap 13, another zone may include the OL HX 20, another zone may include the OL/CL HX 22, combinations thereof, or the like. Within the front air gap 13, a first zone may be defined between the electronic display layer 14 and the cover panel 12, which may also be referred to as the LCD cavity, and a second zone may be defined between the electronic display layer 14 and the illumination device 16, which may also be referred to as the LED cavity. Any number of zones may be defined within the display assemblies 10.

Operational ranges for the air circulating devices 48 may be established, such as at the controller(s) 52. Each of the operational ranges may be associated with one or more of the air circulating devices 48. Desired operating ranges may be established for the sensors 54, such as at the controller(s) 52. Each of the desired operating ranges may be associated with one or more of the sensors 54. Operational ranges for the air circulating devices 48 and/or desired operating ranges for the sensors 54 may be specific to the date, time, ambient conditions, combinations thereof, or the like, and may be programmed at, or stored at, the controller(s) 52. Operational ranges for the air circulation devices 48 and/or desired operating ranges for the sensors may be specific to the zone, air circulation device 48, and/or senor 54 or for the whole display assembly 10. For example, without limitation, operational ranges for the air circulating devices 48 and/or desired operating ranges for the sensors 54 may be specific to day time or night time operations. Such day time and/or night time operations may be determined based on a location of the display assembly 10 and/or time of year (e.g., reflecting sunrise and/or sunset times based on location and date). In exemplary embodiments, without limitation, operational ranges for the air circulating devices 48 associated with the closed loop airflow pathway(s) and/or circulating gas 58 may be set to 100% fan speed during daytime hours and 15-100% during nighttime hours, and operational ranges for the air circulating devices 48 associated with the open loop airflow pathway(s) and/or ambient air 56 may be 0-100% at all times.

Readings from the sensors 54 may be taken, such as continuously, periodically, sporadically, combinations thereof, or the like. Operation (e.g., speed, number of active fans, volumetric flow rate, power supplied, etc.) of some or all of the air circulation devices 48 may be controlled by a highest of readings from the sensors 54 at a given time or period of time relative to the associated desired operating range for the various sensors 54. For example, without limitation, the zone and/or sensor 54 having a highest reading relative to the maximum limit of the desired operating range associated with each zone or sensor 54 may be used by the controller(s) 52 to set the operating conditions of the air circulating devices 48 with the associated operational range. Such sensor 54 and/or zone may be controlling until subsequent readings indicate return to the desired operating range. Alternatively, or additionally, such sensor 54 and/or zone may be controlling until another sensor 54 and/or zone becomes highest and/or the furthers outside of the associated desired operating range. This may enhance thermal management by ensuring that the most problematic zone or sensor 54 reading is driving operations.

The controller(s) 52 may be configured to ramp speed of the air circulating device(s) 48 up or down on a linear basis, inversely proportional ratio, by some multiple or other ratio relative to how far the temperature is from the desired operating range, combinations thereof, or the like. Such adjustments may be made incrementally and readings retaken and adjustments made accordingly.

Such control may be performed on a zone-by-zone basis or for the entire display assembly 10. For example, without limitation, air circulating devices 48 within a given zone and/or associate sensor(s) 54 may be adjusted individually based on such readings, or the air circulation devices 48 for the entire assembly 10 may be adjusted based on such readings, even if from a single zone and/or sensor 54.

Where a maximum operating temperature is reached or exceeded at one or more of the sensors 54, operations of the air circulation devices 48 may be adjusted up to a maximum operational level (e.g., speed, number of active fans, volumetric flow rate, power supplied, etc.) within the operational ranges. If readings from the sensors 52 indicates that the maximum operating temperature subsequently remains reached or exceeded, power to the illumination device 16, such as a backlight, may be reduced until temperatures fall below the maximum operating temperatures. Such reduction may be made in an inversely proportional fashion to how far the temperature has exceeded the maximum operating temperature. Such reduction may be made incrementally and adjustments made accordingly.

Sensor readings may be continuously or periodically retaken and operations adjusted accordingly.

Temperature readings from the sensors 54 may be communicated to the controller(s) 52 which may be configured to make operational determinations and adjustments for said air circulation devices 48 based on said readings. Alternatively, or additionally, such readings may be transmitted, such as by the network communication devices 62, to one or more remote controller(s) 52 located remote from the display assembly 10. Updates to the operational ranges for the air circulating devices 48 and/or desired operating ranges for the sensors 54 may be made from time to time, such as by way of instructions communicated to the controller(s) 52 through the network communication device 62 from one or more remote devices.

The control logic shown and/or described with respect to the several figures and accompanying description provided herein may be used together or separately. For example, without limitation, the control logic shown and/or described with regard to FIG. 8 may be used with the condensation control logic of FIGS. 4-7B or separately therefrom.

While certain measures are shown and/or described herein in terms of degrees Celsius, equivalent measures in degrees Fahrenheit, Kelvin, or other measurement standards may be utilized.

The ambient air 56 within the open loop airflow pathway(s) may be entirely or substantially prevented from mixing with the circulating gas 58 of the closed loop airflow pathway(s). For example, without limitation, the display assembly 10 may be configured to comply with various ingress protection standards, such as, but not limited to, IP 65, IP 66, IP 67, IP 68, combinations thereof, or the like, at least with regard to the closed loop airflow pathway(s) or other particular areas of the assembly 10. Ambient air 56 may comprise air ingested from the surrounding environment and may or may not be filtered. The circulating gas 58 may comprise air kept fully or partially separate from the ambient air 56 in exemplary embodiments. For example, the circulating gas 58 may include ambient air 56 trapped when the assembly 10 is formed or otherwise periodically accessed (e.g., for servicing). Alternatively, or additionally, the circulating gas 58 may comprise filtered or purified air.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like, configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly with enhanced fan control, said display assembly comprising:
   a housing;
   an electronic display located within the housing;
   an airflow pathway extending within the housing;
   fans located at said airflow pathway;
   sensors located at said airflow pathway, said sensors comprising temperature sensors and a humidity sensor; and
   a controller in electronic connection with said one or more sensors and said one or more fans, said controller comprising one or more electronic storage devices comprising software instructions, which when executed, configure one or more processors to, on an ongoing basis:
   receive a reading from each of said sensors;
   determine which of the readings is, relatively, furthest deviated, in a predetermined fashion, from a predetermined, associated parameter, including temperature parameters for the temperature sensors and a humidity parameter for the humidity sensor;
   identify, from the common control scheme, a respective operating parameter for said fans associated with the relatively, furthest deviated one of said readings; and
   drive said fans in accordance with said respective operating parameter.

2. The display assembly of claim 1 wherein:
   said controller comprises additional software instructions stored at said one or more electronic storage devices, which when executed, configure one or more processors to: where any of said readings meet or exceed a respective safety threshold for a respective one said sensors, operate each of said fans at maximum operational speed.

3. The display assembly of claim 2 wherein:
   the electronic display comprises an electronic display layer and an illumination device for illuminating the electronic display layer when activated; and
   said controller comprises additional software instructions stored at said one or more electronic storage devices, which when executed, configure one or more processors to: where any of said readings continue to meet or exceed the respective safety threshold and each of said fans are already operating at maximum operational speed, reduce operating power level of the backlight assembly.

4. The display assembly of claim 1 wherein:
the electronic display comprises an electronic display layer and an illumination device for illuminating the electronic display layer when activated; and
said airflow pathway is a continuous airflow pathway which extends entirely within said housing.

5. The display assembly of claim 1 wherein:
said common control scheme is dependent upon the readings relative to sensor-specific acceptable operating parameters.

6. The display assembly of claim 5 wherein:
the common control scheme comprises fan speed levels which vary in relationship to a difference between the readings from said sensors and the operating parameters in a positive correlation.

7. The display assembly of claim 6 wherein:
the fan speed levels are linearly dependent upon the difference.

8. The display assembly of claim 5 further comprising:
a closed, continuous airflow pathway which extends entirely within said housing, wherein the airflow pathway extends between an intake and an exhaust in said housing.

9. The display assembly of claim 8 wherein:
a first subset of the sensors is located at the closed, continuous airflow pathway; and
a second subset of the sensors is located at the airflow pathway.

10. The display assembly of claim 8 wherein:
a first subset of the fans is located at the closed, continuous airflow pathway; and
a second subset of the fans is located at the airflow pathway.

11. The display assembly of claim 10 wherein:
the common control scheme includes different reading-dependent, preprogrammed operating parameters for at least some of the fans.

12. The display assembly of claim 11 wherein:
the first subset of the fans is controlled in accordance with a first set of reading-dependent, preprogrammed operating parameters of the common control scheme; and
the second subset of the fans is controlled in accordance with a second set of reading-dependent, preprogrammed operating parameters of the common control scheme.

13. The display assembly of claim 5 wherein:
said controller comprises additional software instructions stored at said one or more electronic storage devices, which when executed, configure one or more processors to: establish zones within said housing, wherein at least one of said sensors is located within each of said zones.

14. The display assembly of claim 1 wherein:
the predetermined parameter is a dewpoint spread threshold.

15. The display assembly of claim 14 wherein:
said controller comprises additional software instructions stored at said one or more electronic storage devices, which when executed, configure one or more processors to:
determine a dewpoint based on the relatively highest one of said readings;
determine a local dewpoint;
determine a dewpoint spread between the dewpoint and the local dewpoint;
where said dewpoint spread is above the dewpoint spread threshold, initiate modified operations; and
while said dewpoint spread is below the dewpoint spread threshold, forgo the modified operations.

16. A display assembly with enhanced fan control, said display assembly comprising:
a housing comprising an intake and an exhaust, each open to an ambient environment;
an electronic display layer located within the housing;
a cover positioned forward of said electronic display layer;
an illumination device positioned rearward of the electronic display layer to illuminate the electronic display layer when powered;
a first airflow pathway extending within the housing between said intake and said exhaust to form an open airflow pathway;
a second airflow pathway extending entirely within said housing to form a closed, continuous airflow pathway;
fans comprising a first set of one or more fans located at said first airflow pathway and a second set of one or more fans located at said second airflow pathway;
sensors comprising a first set of one or more temperature sensors located at said first airflow pathway, a second set of one or more temperature sensors located at said second airflow pathway, and a set of one or more humidity sensors located at said first airflow pathway; and
a controller in electronic connection with said sensors and said fans, said controller comprising one or more electronic storage devices comprising software instructions, which when executed, configure one or more processors to:
establish zones within said display assembly, including at least a first zone located at the first airflow pathway and a second zone located at the second airflow pathway, wherein at least one of said first set of one or more temperature sensors and at least one of said first set of one or more fans is located within the first zone and at least one of the second set of one or more temperature sensors and at least one of said second set of one or more fans is located within the second zone;
establish an acceptable operating parameter for data received from each of said sensors, wherein said operating parameters are different between said zones, the acceptable operating parameters comprising temperature thresholds;
establish a common control scheme for each of said fans, wherein said common control scheme comprises fan speed levels which vary relative to a difference between a reading from a respective subset of one or more of said sensors and a respective one of the operating parameters associated with the respective subset of one or more of said sensors in a positively correlated fashion, and wherein said fan speed levels of said common control scheme are different between said zones; and
on an ongoing basis for each of said zones on a zone-by-zone basis:
receive the readings from said sensors;
determine which of said readings is, relatively, furthest deviated above the associated operating parameter for the respective sensor;
identify a respective one of the fan speed levels for the respective zone of said common control scheme associated with the relatively furthest deviated one of said readings; and drive said fans of the respective zone at the respective fan speed level.

17. A display assembly with enhanced fan control, said display assembly comprising:
a housing;
an electronic display located within the housing;
one or more airflow pathways extending, at least in part, within said housing;
fans located at each of said one or more airflow pathways;
sensors located at each of said one or more airflow pathways, said sensors comprising multiple temperature sensors and at least one humidity sensor; and
a controller in electronic connection with said sensors and said fans, said controller comprising one or more electronic storage devices comprising software instructions, which when executed, configure one or more processors to:
establish acceptable operating thresholds for said sensors;
establish a common control scheme for said fans comprising sensor-reading-specific fan operating levels for said fans; and
on an ongoing basis:
receive the readings from said sensors;
determine which of said readings is, relatively, furthest deviated from the acceptable operating parameter(s) associated with the respective sensor;
identify a respective one of the fan operating levels associated with the relatively furthest deviated one of the readings; and
drive said fans at the respective one of the fan operating levels.

18. The display assembly of claim 17 wherein:
said one or more airflow pathways comprises an open airflow pathway and a closed, continuous airflow pathway;
a first set of said fans are located at the open airflow pathway; and
a second set of said fans are located at the closed, continuous airflow pathway.

19. The display assembly of claim 18 wherein:
the operating parameters and the control scheme are different for at least some of said sensors.

* * * * *

UNITED STATES PATENT AND TRADEMARK OFFICE
CERTIFICATE OF CORRECTION

| | | |
|---|---|---|
| PATENT NO. | : 12,477,683 B2 | Page 1 of 1 |
| APPLICATION NO. | : 19/034216 | |
| DATED | : November 18, 2025 | |
| INVENTOR(S) | : William Dunn et al. | |

It is certified that error appears in the above-identified patent and that said Letters Patent is hereby corrected as shown below:

In the Specification

In Column 3, Line 59, please delete "AC" and insert -- A°C --.

Signed and Sealed this
Tenth Day of February, 2026

John A. Squires
*Director of the United States Patent and Trademark Office*